(12) United States Patent
Yamatsu et al.

(10) Patent No.: US 6,188,467 B1
(45) Date of Patent: Feb. 13, 2001

(54) METHOD AND APPARATUS FOR FABRICATING SEMICONDUCTOR DEVICES

(75) Inventors: Yasuyoshi Yamatsu, Kokubunji-machi; Fumiaki Kitayama, Utsunomiya, both of (JP)

(73) Assignee: Canon Kabushiki Kaisha, Tokyo (JP)

( * ) Notice: Under 35 U.S.C. 154(b), the term of this patent shall be extended for 0 days.

(21) Appl. No.: 09/093,768

(22) Filed: Jun. 9, 1998

(30) Foreign Application Priority Data

Jun. 13, 1997 (JP) .................................................... 9-171260
Jun. 13, 1997 (JP) .................................................... 9-171261

(51) Int. Cl.[7] ........................... G03B 27/42; G01R 31/26; B65G 47/24; G01B 11/00; B25J 1/133
(52) U.S. Cl. ................................. 355/72; 355/72; 355/53; 438/16; 356/401; 198/394; 414/757; 430/5
(58) Field of Search .................................. 355/72, 65, 47, 355/18, 53; 438/16; 356/401

(56) References Cited

U.S. PATENT DOCUMENTS

| | | | |
|---|---|---|---|
| 3,297,134 | * | 1/1967 | Pastuszak .............................. 198/379 |
| 3,865,254 | * | 2/1975 | Johannsmeier .................... 214/1 BH |
| 3,930,684 | * | 1/1976 | Lasch et al. .......................... 302/2 R |
| 4,345,836 | * | 8/1982 | Philips .................................... 355/53 |
| 4,376,482 | * | 3/1983 | Wheeler et al. ..................... 198/394 |
| 4,407,627 | * | 10/1983 | Sato et al. ............................. 414/757 |
| 4,655,584 | * | 4/1987 | Tanaka et al. ......................... 355/53 |
| 5,432,608 | * | 7/1995 | Komoriya et al. ................... 356/401 |
| 5,861,320 | * | 1/1999 | Shiraishi ............................... 438/16 |

* cited by examiner

Primary Examiner—Russell Adams
Assistant Examiner—Rajhuveer Bindingnavele
(74) Attorney, Agent, or Firm—Fitzpatrick, Cella, Harper & Scinto

(57) ABSTRACT

An apparatus for fabricating a device includes a stage for holding a substrate to be treated, a hand for carrying the substrate to the stage, and a mark detecting system for detecting a mark formed on the substrate, before the substrate is transferred to the stage, in order to roughly position the substrate. The hand is provided with a reference mark which can be detected by the mark detecting system, and the mark detecting system detects a mark of the substrate and the reference mark of the hand. Also, the hand can carry the substrate to the stage after rotating the stage in a rotational direction in response to a value detected by the mark detecting system.

13 Claims, 10 Drawing Sheets

FIG. 8A
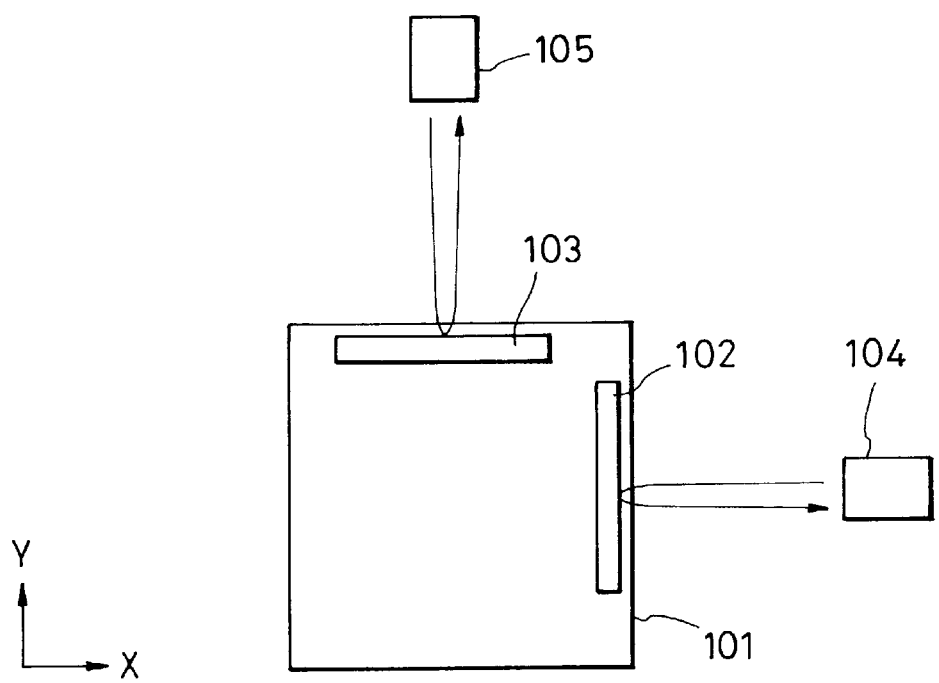
FIG. 8C
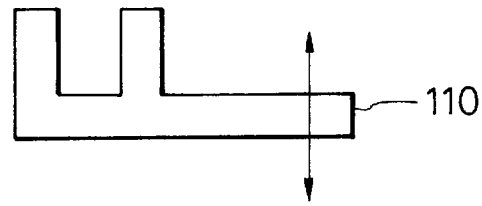
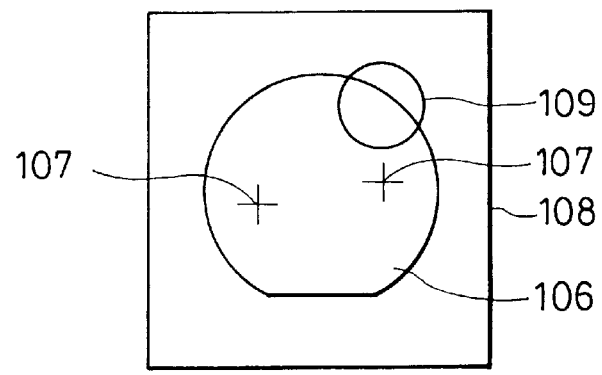
FIG. 8B

FIG. 9A
FIG. 9B
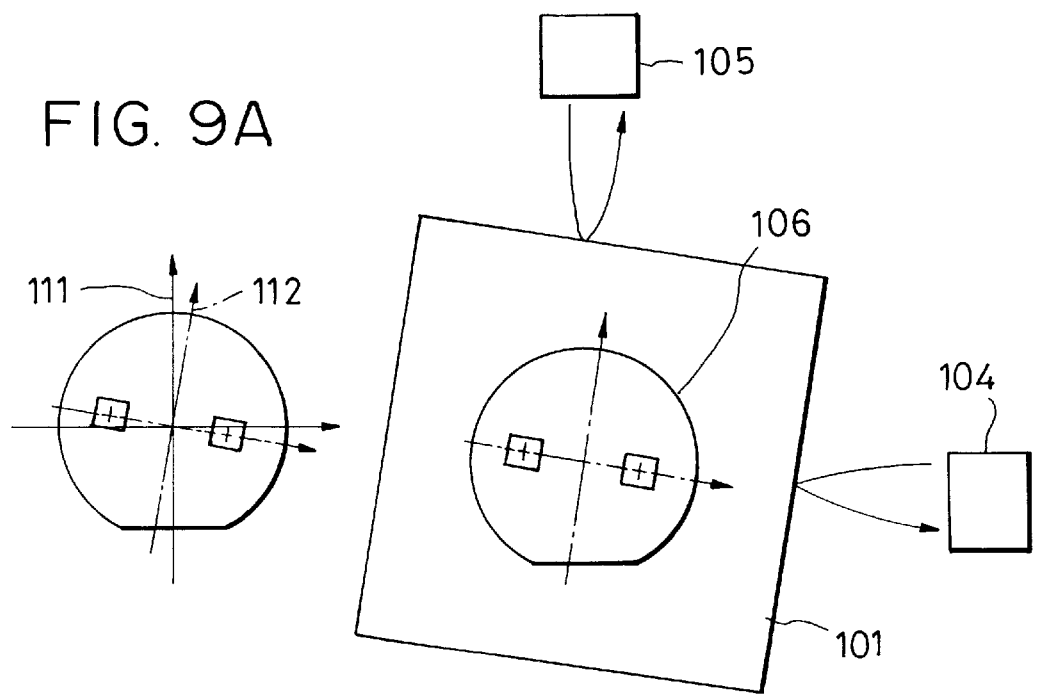
FIG. 9C
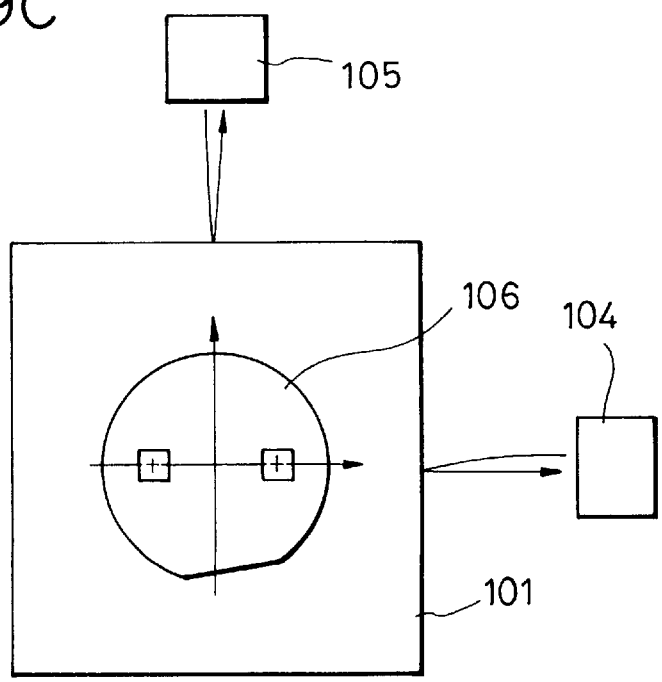

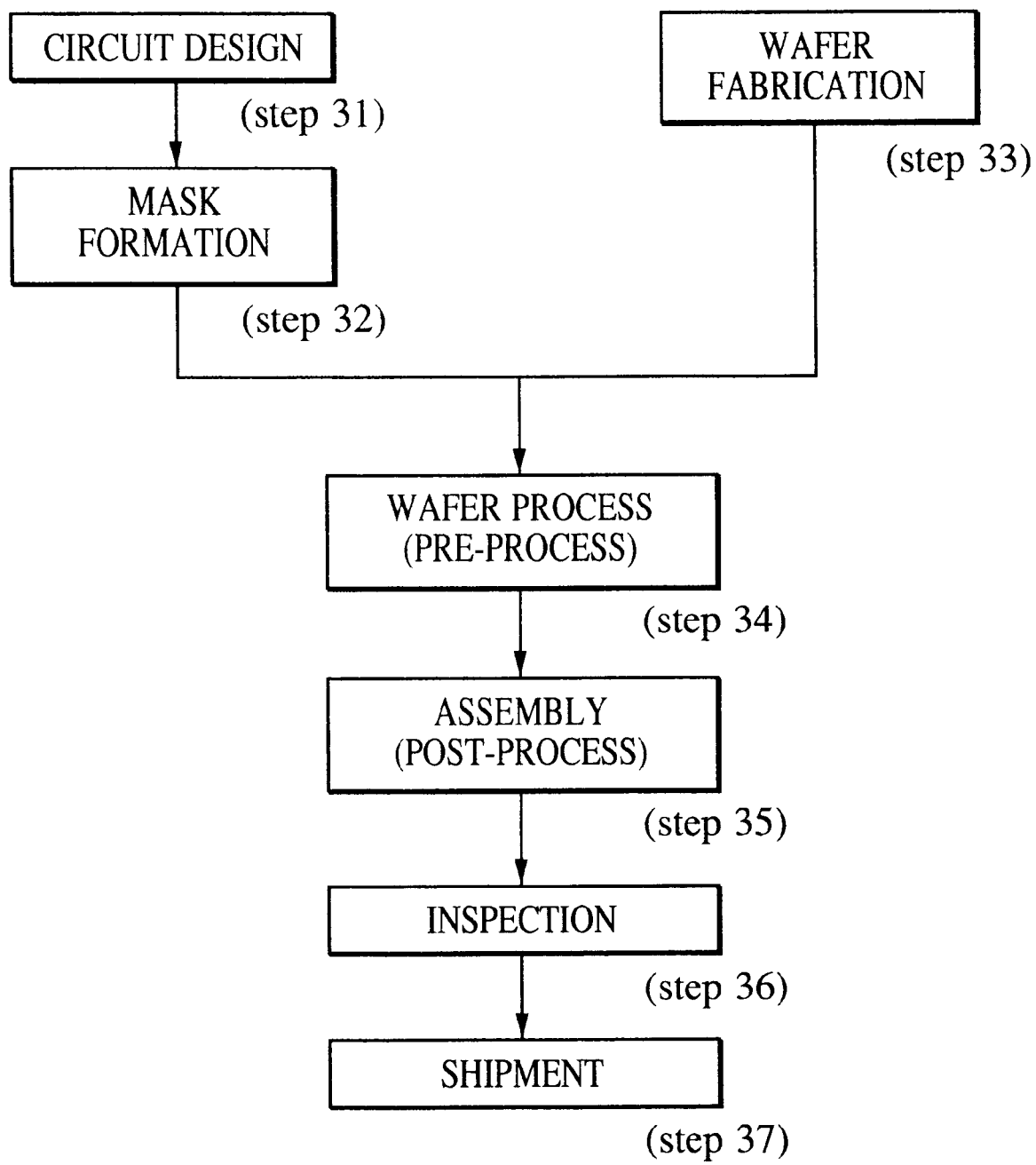

METHOD AND APPARATUS FOR FABRICATING SEMICONDUCTOR DEVICES

BACKGROUND OF THE INVENTION

1. Field of the Invention

The present invention relates to an apparatus for fabricating semiconductors that are used for fabricating semiconductor devices, in particular, to an apparatus for fabricating semiconductors, for example, an exposure apparatus provided with a prealignment mechanism for prealigning substrates, such as wafers or the like, which are to be exposed to exposure light, and to a method for fabricating devices using the same.

2. Description of the Related Art

In a conventional apparatus for fabricating a semiconductor or the like, prior to transferring a substrate to a substrate-treating stage, rough positioning (prealignment) is performed so that an alignment deviation of the substrate is brought within a given range. The rough positioning has been performed using a prealignment device having a mark detecting system which measures a mark on the substrate by detecting the mark before the substrate is transferred onto the substrate-treating stage.

In comparison with the final alignment accuracy that is required once the substrate is transferred to the stage, however, the alignment accuracy provided by the prealignment device is generally lower. Therefore, the substrate remains somewhat misaligned after the prealignment.

In order to compensate for the misalignment remaining after the prealignment, a more precise means for measuring the alignment marks, such as an image processor or the like, is generally provided close to the stage. After the prealigned substrate is placed on the stage, the alignment mark on the substrate is measured, and then the misalignment is compensated for with the substrate on the stage.

In the conventional technique described above, however, the misalignment can be measured only after the substrate is placed on the stage. As a result of the measurement, a misalignment may be determined to be a deviation of δ in a θ direction between an XY coordinate system of the stage and an XY coordinate system of the marks on the substrate. In this case, substrate treatment, such as an exposure treatment or the like, is performed after the misalignment is removed by either (i) holding the substrate again on the stage and correcting the relative position between the stage and the substrate by the deviation δ in the θ direction or (ii) rotating the stage by the deviation δ in the θ direction without holding the substrate again.

Once the substrate is held again, however, the duration of treating the substrate on the stage increases, resulting in a decrease in the throughput of the apparatus.

Also, the current position of the stage is typically measured by radiating a laser beam onto a mirror on the stage and measuring the reflected light. If the stage is rotated in the θ direction, the mirror for measuring the position is also rotated. The rotation of the mirror causes a deviation of the optical axis of the reflected laser light for measuring the position, which leads to a measurement error. This is referred to as Abbe error. Thereby, when the stage is rotated, the Abbe error must be compensated for in order to precisely measure the position. Although various approximations are used to compensate for the error, with an increase in the Abbe error, a difference between the approximate value and the theoretical value increases. That is, as the stage is rotated further in the θ direction, the positional measurement error of the stage caused by the Abbe error increases.

Also, if the stage is rotated in the θ direction, a deviation of the optical axis of the laser light reflected from the mirror occurs, as described above, and if the misalignment becomes too large, the reflected laser light cannot be measured, because the deviation of the optical axis becomes too great.

Also, in the conventional prealignment device, in spite of the fact that a deviation is calculated based on the position of the mark detecting system, there is no means for accurately determining the position of the mark detecting system itself, or for correcting the position of the mark detecting system. Thus, if the position of the mark detecting system changes with time, the detected deviation includes an error, resulting in an inaccuracy in the deviation from the reference position in the X and Y to directions and in the θ direction, with respect to the Z axis as a center.

The disadvantages referred to above will be described in detail with reference to FIG. 12 and FIG. 13. FIG. 12 is a schematic diagram wherein a mark detecting system lies in an ideal position. In the drawing, numeral 51 represents an expected position of a substrate held by a substrate carrier device (e.g., a carrying hand), numeral 52 represents an expected center of the substrate when at expected position 51, numeral 54 represents a center of the mark detecting system, numeral 55 represents a range to be measured by the mark detecting system, numeral 56 represents the position of a mark detected on the substrate, letter B represents a detected deviation of the substrate, numeral 53 represents the true position of the substrate as determined based on the detected deviation B, numeral 57 represents a position of a chuck, which is used as a device for holding the substrate before the deviation is corrected, numeral 58 represents a center of the chuck before the deviation is corrected, letter C represents a fixed operation length of the carrying hand, which is used for carrying the substrate from the mark detecting system to the chuck on the stage, numeral 60 represents a center of the chuck corrected in response to the detected deviation B, and numeral 61 represents an outline of the chuck, the position of which has been corrected in response to the detected deviation B.

In accordance with the conventional example, if the carrying hand holding the substrate is operated by an additional length corresponding to the detected deviation B when it is being operated to move by an amount corresponding to the fixed operation length C to place the substrate on the chuck, it is possible to accurately match up the center of the chuck with the center of the substrate.

However, as shown in FIG. 13, if the position of the mark detecting system itself changes to a position represented by numeral 62, the center of the mark detecting system deviates up to a position represented by numeral 54', and therefore, the positional deviation of the substrate will be changed to that shown by a differential B'. As a result, although the chuck is required to be moved up to the position represented by numeral 61 in order to accurately match up the center of the chuck with the center of the substrate, the chuck will actually be positioned at the position represented by numeral 63. That is, in spite of having performed a precise prealignment, the substrate is carried onto the device for holding the substrate with a wide deviation. Therefore, it may be necessary to perform the prealignment again, on the device for holding the substrate. Thus, the desired improvement of the throughput may not be achieved.

SUMMARY OF THE INVENTION

It is an object of the present invention to solve the problems in the known art described above.

In one aspect, an apparatus for fabricating a device, is in accordance with the present invention, includes a stage for holding a substrate to which treatment is performed, the substrate having a mark formed thereon, a hand for carrying the substrate to the stage, the hand having a reference mark formed thereon, and a mark detecting system for detecting the mark formed on the substrate, before the substrate is transferred to the stage, and for detecting the reference mark of the hand, in order to roughly position the substrate.

In another aspect, an apparatus for fabricating a semiconductor, in accordance with the present invention, includes a stage for holding a substrate to which treatment is performed, the substrate having marks formed thereon, a hand for carrying the substrate to the stage, and a mark detecting system for detecting the marks formed on the substrate, before the substrate is transferred to the stage, in order to roughly position the substrate. The hand carries the substrate onto the stage after the stage is rotated in a rotational direction in response to a value detected by the mark detecting system.

In another aspect, a method for fabricating a semiconductor, in accordance with the present invention, includes holding, with a stage, a substrate to which treatment is performed, the substrate having a mark formed thereon, carrying, with a hand, the substrate to the stage, the hand having a reference mark formed thereon, detecting, with a mark detecting system, the mark formed on the substrate, before the substrate is transferred to the stage, and detecting the reference mark on the hand, in order to roughly position the substrate, and fabricating the semiconductor after the substrate is positioned on the stage.

In still another aspect, a method for fabricating a semiconductor, in accordance with the present invention, includes holding, with a stage, a substrate to which treatment is performed, the substrate having marks formed thereon, carrying, with a hand, the substrate to the stage, detecting, with a mark detecting system, the marks formed on the substrate, before the substrate is transferred to the stage, in order to roughly position the substrate, wherein the hand carries the substrate onto the stage after rotating the stage in a rotational direction in response to the detection by the mark detecting system, and fabricating the semiconductor after the substrate is positioned on the stage.

The above and other objects, features and advantages of the present invention will become clear from the following description of the preferred embodiments.

BRIEF DESCRIPTION OF THE DRAWINGS

FIGS. 8A through 8C are schematic representations of an apparatus for fabricating a semiconductor as a second embodiment of the present invention, wherein, after the positional deviation of the substrate, obtained by measuring the marks on the substrate, is corrected by a substrate-treating stage, the substrate is transferred;

FIGS. 9A through 9C are schematic representations which show the operation of carrying the substrate from the substrate carrier device to the substrate-treating stage;

FIG. 10 is a flow chart of the processes for fabricating micro-devices by using the apparatus shown in FIG. 1 as an exposure apparatus;

DESCRIPTION OF THE PREFERRED EMBODIMENTS

Figure 1:
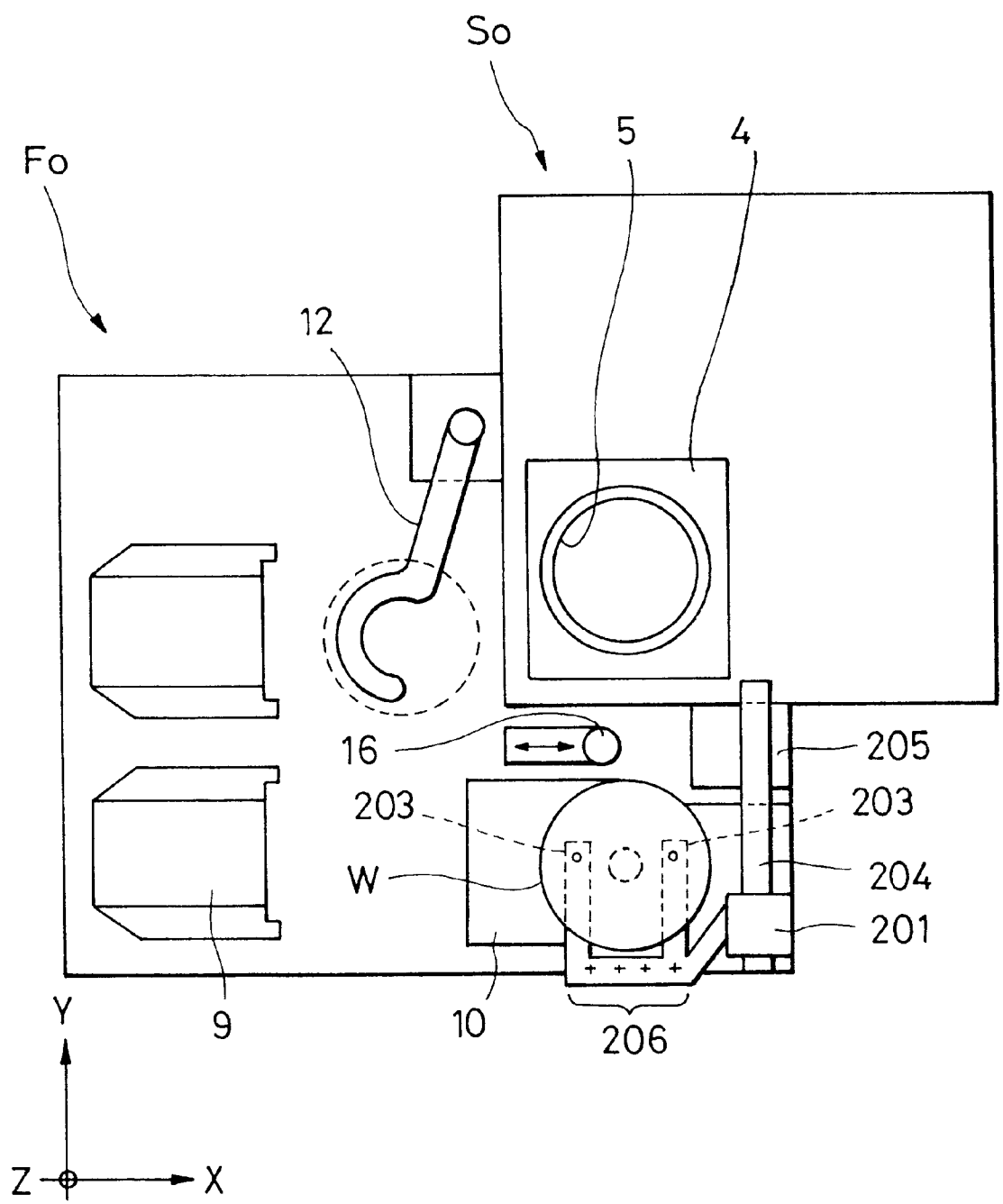
FIG. 1 is a schematic diagram of the key portion of an apparatus for fabricating a semiconductor as an embodiment of the present invention.

FIG. 1 is a schematic diagram of the key portion of an apparatus for fabricating a semiconductor as an embodiment of the present invention. As shown in the drawing, a substrate-supply unit Fo for automatically supplying and recovering substrates is arranged on the side of a substrate-treatment unit (exposure apparatus) So. The substrate-supply unit Fo includes a supply cassette 9 which stores substrates, a prealignment mechanism 10 for prealigning the substrates successively taken out of the supply cassette 9, and a carrying hand 201 for carrying prealigned wafers to the substrate-treatment unit So. A mark detecting system 16 detects the position of a mark on the substrate held by the carrying hand 201, and can be moved in the X direction, which is orthogonal to the direction of movement of the carrying hand 201. The carrying hand 201 includes a linear guide 204, a vertical operating section 205, and a vacuum section 203 for holding the substrates by suction, and also is provided with reference marks 206. The position of the reference marks 206 can be detected by the mark detecting system 16. The substrates are carried by the carrying hand 201 onto a stage system which includes a stage 4, which moves two-dimensionally in the X and Y directions, and a chuck 5, which is provided for fine alignment and exposure treatment. The substrates are recovered by a recovery hand 12 after the treatment.

Figure 2:
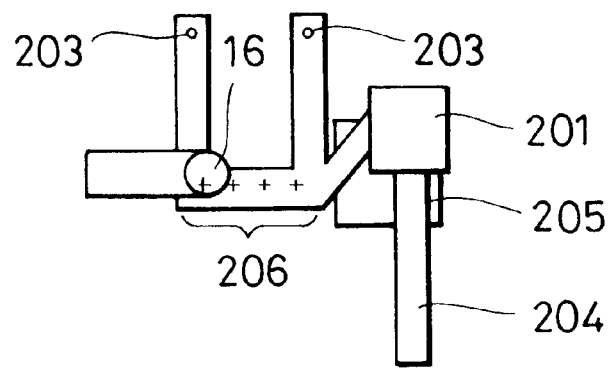
FIG. 2 is a schematic diagram showing a state in which a carrying hand 201 is operated underneath a mark detecting system 16, which detects one of several reference marks 206 in order to obtain data for correcting the position of the mark detecting system with reference to the apparatus shown in FIG. 1.

FIG. 2 is a schematic diagram showing a state in which the carrying hand 201 is operated underneath the mark detecting system 16, which detects one of the reference marks 206 provided on the carrying hand 201 in order to obtain data for correcting the position.

Figure 3:
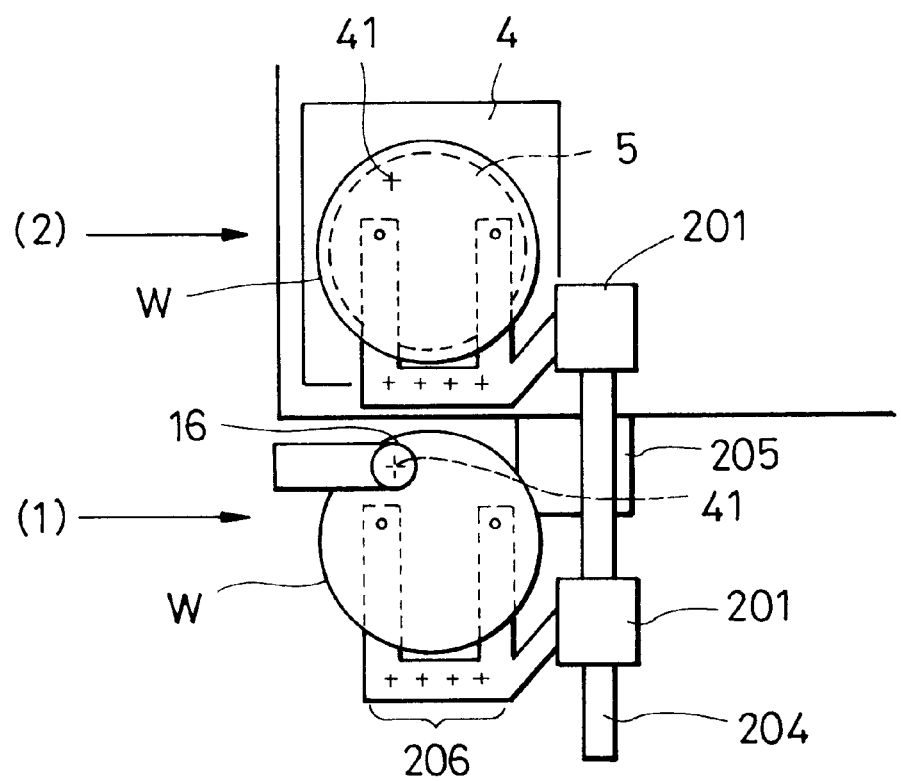
FIG. 3 is a schematic diagram showing a method for detecting a mark 41 (e.g., a cross) on a substrate W by operating the carrying hand 201 holding the substrate W underneath the mark detecting system 16 in order to determine a deviation of the substrate W with reference to the apparatus shown in FIG. 1.

FIG. 3 is a schematic diagram showing a method for detecting a mark (e.g., a cross) on a substrate W by operating the carrying hand 201 holding the substrate W underneath the mark detecting system 16 in order to obtain a deviation of the substrate W.

The operation of the structures discussed above will now be described. First, the data for correcting the position of the mark detecting system 16 is calculated as follows. The mark detecting system 16 is moved so that a mark on the substrate is within a range to be measured. Next, the carrying hand 201 is moved along the linear guide 204 until its reference marks 206 are positioned beneath the mark detecting system 16, and then, the carrying hand 201 is elevated by the vertical operating section 205 until the upper surfaces of the reference marks 206 are positioned at the focal plane of the mark detecting system 16. Alternatively, the mark detecting system 16 may be provided with a focus system in advance, which comes into focus by operating the mark detecting system 16. At the position shown in FIG. 2, the reference marks 206 on the carrying hand are detected, and then, a positional error A from the ideal position of the mark detecting system 16 is calculated.

In the next step, a substrate is loaded for the treatment. The substrate, which is taken out of the supply cassette 9 and loaded onto the prealignment mechanism 10 by a robot (not shown in the drawing), is aligned to a predetermined position by the prealignment mechanism 10, and then is held by suction by the vacuum section 203 of the carrying hand 201.

Next, as shown in FIG. 3, the carrying hand 201 is moved along the linear guide 204 until a cross mark 41 on the substrate lies beneath the mark detecting system 16, i.e., at the position (1) shown in FIG. 3, and then, the carrying hand 201 is elevated by the vertical operating section 205 until the surface of the substrate is positioned at the focal plane of the mark detecting system 16. Alternatively, the mark detecting system 16 may be provided with a focus system in advance, which comes into focus by operating the mark detecting system 16.

At this position, the cross mark 41 on the substrate is detected, and a deviation B from the reference position is measured. Based on the deviation B of the cross mark 41, a positional error of the wafer relative to the reference position in the X, Y, and θ directions is calculated, and the error is corrected with respect to the positional error A of the mark detecting system 16.

The corrected positional error is used as an offset value regarding the movement of the stage 4 to the substrate receipt position (shown in FIG. 1), and then, the carrying hand 201 is transferred to the substrate-supply position, i.e., the position (2) in FIG. 3, to deliver the substrate onto a chuck 5 by operating the vertical operating section 205 downward. Thus, the substrate is placed on the chuck 5 in a state in which the center of the substrate and the center of the chuck accurately match up with each other.

Since the substrate received by the chuck 5 is accurately positioned, another measurement is not required for prealignment of the substrate on the chuck 5. Therefore, the substrate can be directly transferred to the final precise alignment position (not shown in the drawing) for the substrate-treatment process. The treated substrate is transferred to the recovery position by the stage 4 and is recovered by the recovery hand 12.

Figure 4:
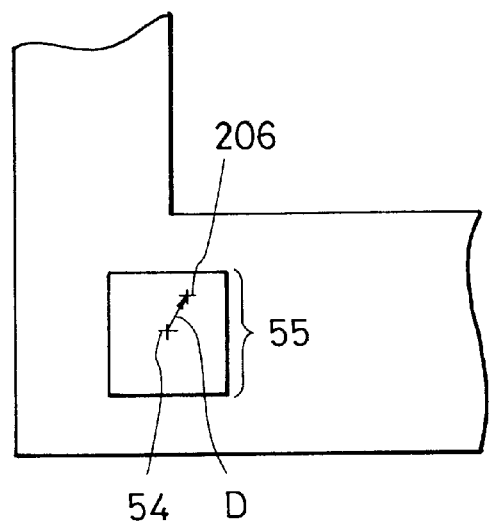
FIG. 4 is a vector diagram showing a state in which the position D of the reference marks 206 on the carrying hand 201 is detected before the position of the mark detecting system 16 deviates with reference to the apparatus shown in FIG. 1.
Figure 5:
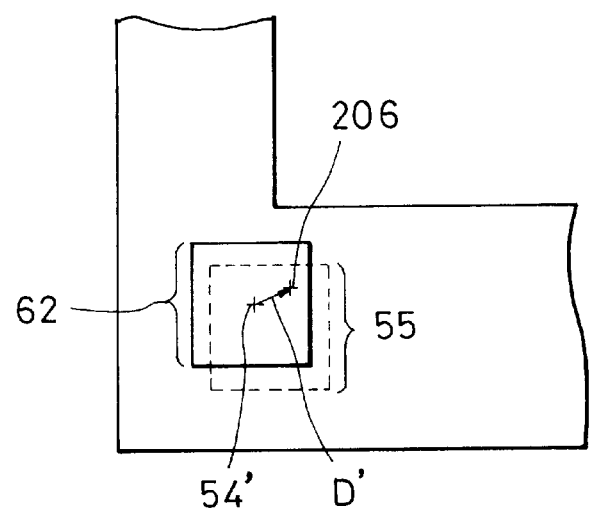
FIG. 5 is a vector diagram showing a state in which the position D' of the reference marks 206 on the carrying hand 201 is detected after the position of the mark detecting system 16 deviates to the position 62 with reference to the apparatus shown in FIG. 1.
Figure 6:
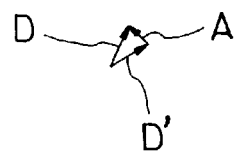
FIG. 6 is a vector diagram for calculating a positional error A from the ideal position of the mark detecting system with reference to the apparatus shown in FIG. 1.

The method for correcting the deviation will be described in detail with reference to FIG. 4 and FIG. 5. FIG. 4 shows a state in which the position D of the reference marks 206 on the carrying hand 201 is detected before the position of the mark detecting system 16 deviates. FIG. 5 shows a state in which the position D' of the reference marks 206 on the carrying hand 201 is detected after the central position of the mark detecting system 16 deviates to the position 54'. As shown in FIG. 6, the positional error A from the ideal position of the mark detecting system 16 corresponds to an equation: A=D−D'.

Figure 7:
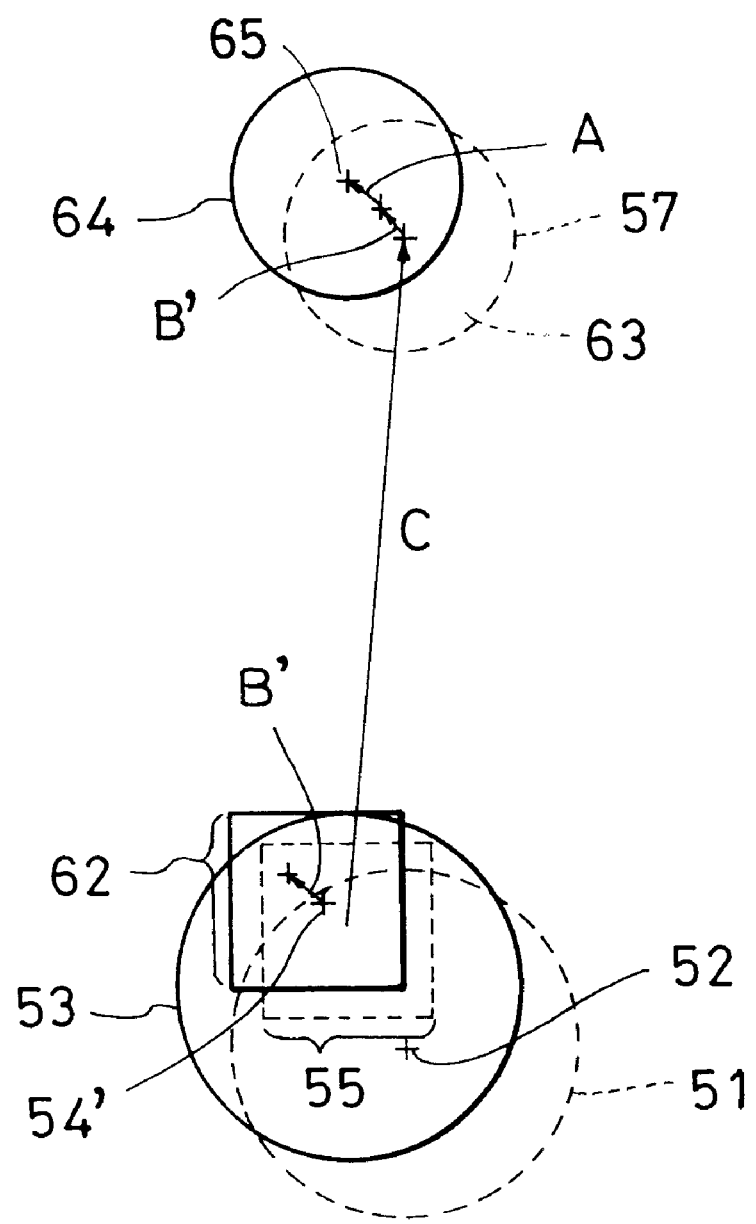
FIG. 7 is a vector diagram showing a state in which the deviation of the substrate is compensated for by the positional error A with reference to the apparatus shown in FIG. 1.

As shown in FIG. 7, if the deviation B' of the substrate from the reference position is corrected by the calculated positional error A and the chuck 5 is transferred by the distance of A+B', the corrected center of the chuck corresponds to the position shown by numeral 65 and the outline of the chuck corresponds to the position 64, that is, the position of the chuck corresponds to that when the mark detecting system lies at the ideal position. Therefore, the substrate is received at the chuck in the state in which the center of the substrate and the center of the chuck accurately match up with each other.

In accordance with this embodiment, the substrate is delivered after the movement on the side of the stage 4 is corrected. However, the correction may be carried out after the substrate is delivered, as an offset to the movement of the stage 4 to the position at which the substrate-treatment is performed.

As described above, the reference marks are provided on the hand for carrying the substrate, and the position of the reference marks is detected by the mark detecting system. Taking the detected result into consideration, the error caused by the positional fluctuation of the mark detecting system is corrected, and therefore, the substrate-treatment can be performed while always recognizing the accurate position of the substrate. Accordingly, a second prealignment or the like is not required, and the throughput can be improved stably in the simple and inexpensive structure.

FIGS. 8A through 8C are schematic representations which show most effectively the characteristics of a second embodiment of the present invention. As shown in FIG. 8A, numeral 101 represents a stage for performing substrate treatment (e.g., fine alignment and exposure treatment) of an apparatus for fabricating a semiconductor, numeral 102 represents a mirror provided on the stage 101 for detecting the position of the stage 101 in the X direction, numeral 103 represents a mirror provided on the stage 101 for detecting the position of the stage 101 in the Y direction, numeral 104 represents an X-direction laser radiation device for radiating a laser onto the mirror 102, and numeral 105 represents a Y-direction laser radiation device for radiating a laser onto the mirror 103. As shown in FIG. 8B, numeral 106 represents a substrate such as a semiconductor wafer or the like, numeral 107 represents alignment marks formed on the substrate 106, which are used for the precise alignment of the substrate on the stage 101, numeral 108 represents a prealignment device for aligning the periphery of the substrate 106, and numeral 109 represents a mark detecting system provided inside the prealignment device 108 for measuring the positions of the alignment marks 107 formed on the substrate 106. As shown in FIG. 8C, numeral 110 represents a carrying hand for carrying the substrate 106, which has been aligned based on its periphery onto the stage 101.

The operation of the apparatus will be described with reference to FIGS. 8A through 8C. First, the substrate 106 is delivered onto the prealignment means 108 by a device (not shown in the drawing). The delivered substrate 106 is aligned based on its periphery (orientation flat) so that the marks 107 on the substrate 106 can be measured. Then, the alignment marks 107 on the substrate 106 are measured by the mark detecting system 109 provided inside the prealignment means 108 to calculate a misalignment deviation of the substrate from a predetermined position in the θ direction.

The calculation of the misalignment deviation can be performed, for example, by the following method.

By relatively moving the substrate 106 and the mark detecting system 109 with a transfer mechanism of the prealignment means 108, at least two marking positions, which are supposed to have the same Y coordinate on the substrate 106 on the XY coordinate system of the prealignment means, are measured. The measurement results are expressed as $(X_1, Y_1)$ and $(X_2, Y_2)$.

Based on the above measurement results, the misalignment deviation δ in the θ direction is determined as follows:

Misalignment deviation δ

$$\text{in the } \theta \text{ direction} = \tan^{-1}\left(\frac{Y_1 - Y_2}{X_1 - X_2}\right).$$

After obtaining the misalignment deviation δ as described above, the substrate 106 is transferred from the prealignment means 108 to the carrying hand 110. Next, the stage 101 is rotated by the misalignment deviation δ in the θ direction, and then, the substrate 106 is transferred from the carrying hand 110 to the stage 101 for the fine alignment and exposure treatment.

The transfer operation of the substrate 106 from the carrying hand 110 to the stage 101 will be described with reference to FIGS. 9A through 9C. FIG. 9A is a schematic representation showing the state of the substrate after the prealignment, in which numeral 111 corresponds to the XY coordinate system of the stage and numeral 112 corresponds to the XY coordinate system formed by the marks on the substrate. As described above, the substrate after the prealignment inevitably has a misalignment represented by the disagreement between the coordinate systems 111 and 112. Accordingly, after rotating the stage 101 in response to the misalignment deviation, the substrate 106 is carried onto the stage 101 by the carrying hand 110, as shown in FIG. 9B. Then, the stage 101 is rotated back to the original position, as shown in FIG. 9C.

As described above, prior to carrying the substrate 106 onto the stage 101, the misalignment deviation in the θ direction is measured, and the position for receiving the substrate at the stage 101 is corrected by rotating the stage 101 itself in response to the misalignment deviation. Then, the substrate is delivered. Thereby, as shown in FIG. 9C, the deviation θ between the XY axes formed by the marks on the substrate and the XY axes of the stage 110 is removed.

Although one mark detecting system 109 is provided inside the prealignment means 108 in this embodiment, the mark detecting system 109 may be provided anywhere on the course by which the substrate 106 is transferred onto the stage 101 after the prealignment based on the periphery is complete. For example, as in the previous embodiment, the mark detecting system 109 may be provided on the transfer course of the carrying hand 110 so that the marks 107 on the substrate 106 are measured during the transfer of the substrate 106 by the carrying hand 110.

Also, a plurality of mark detecting systems may be provided so as to measure a plurality of marks 107 on the substrate 106 at the same time. Also, although two marks on the substrate 106 are measured in this embodiment, additionally, a plurality of marks may be measured to improve the accuracy in the calculated alignment deviation by statistically processing a plurality of corresponding data, for example, by calculating the average and extracting abnormal data.

As described above, since the substrate carried onto the stage has substantially no misalignment in the θ direction, the following advantages can be obtained.

(1) A decrease in the throughput of the apparatus can be prevented, because the substrate is not required to be held again on the stage.

(2) Measurement error (Abbe error) caused by a deviation of the optical axis of the reflected laser light can be reduced at the time of measuring the position of the stage (i.e., the substrate on the stage). Thus, the positional measurement error resulting from the correction of the Abbe error can be minimized, and the positional measurement accuracy (i.e., the alignment accuracy of the substrate) can be improved.

A method for fabricating devices, which uses an exposure apparatus as the above-mentioned apparatus for fabricating semiconductors, will be described as an embodiment of the present invention. FIG. 10 is a flow chart of the processes for fabricating micro-devices such as semiconductor chips, for example, IC's and LSI's, liquid crystal panels, CCD's, thin-film magnetic heads, and micromachines. In step 31 (circuit design), a circuit for a semiconductor device is designed. In step 32 (mask formation), a mask provided with the designed circuit pattern is formed. In step 33 (wafer fabrication), wafers are fabricated using silicon or the like. Step 34 (wafer process) is referred to as a pre-process, in which an actual circuit is formed on the wafer by lithography, using the mask and the wafer. Step 35 (assembly) is referred to as a post-process, in which the wafer formed in step 34 is processed to form semiconductor chips, and includes an assembly process (e.g., dicing and bonding), a packaging process (e.g., chip encapsulation) and so on. In step 36 (inspection), the semiconductor device fabricated in step 35 is inspected, including, for example, a performance test and an endurance test. The semiconductor device is shipped after completion in step 37.

Figure 11:
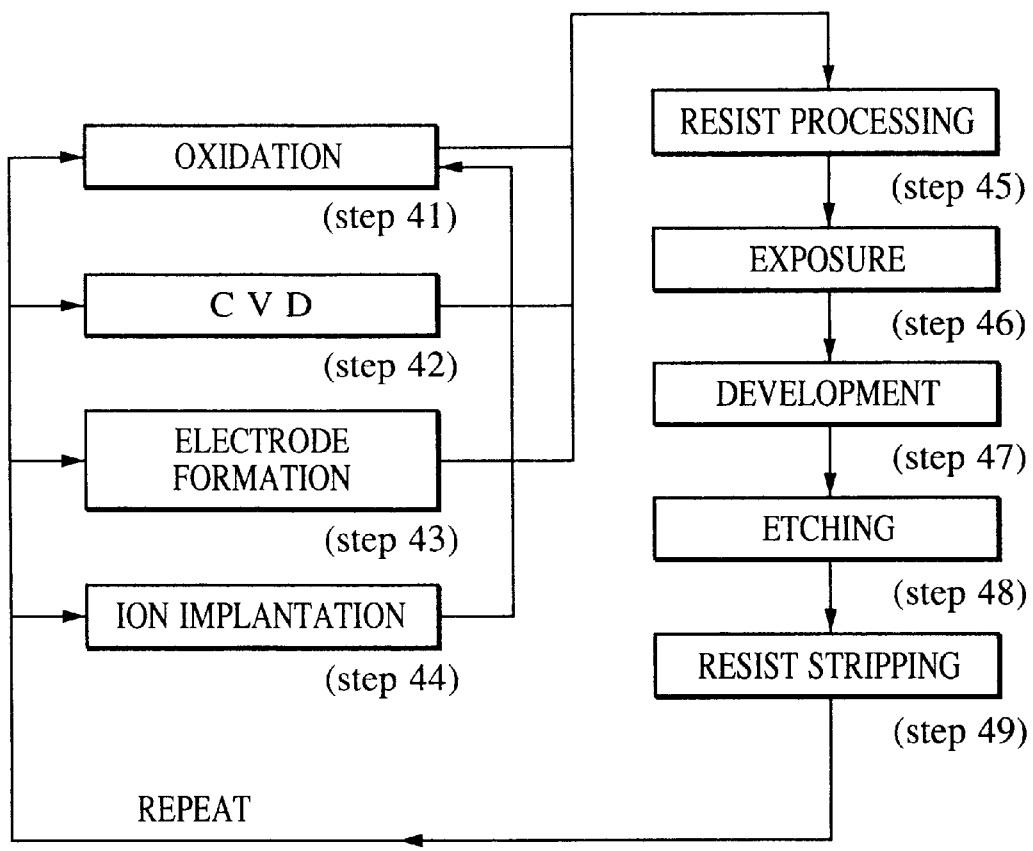
FIG. 11 is a flow chart which shows a detailed flow of the wafer process in FIG. 10.
Figure 12:
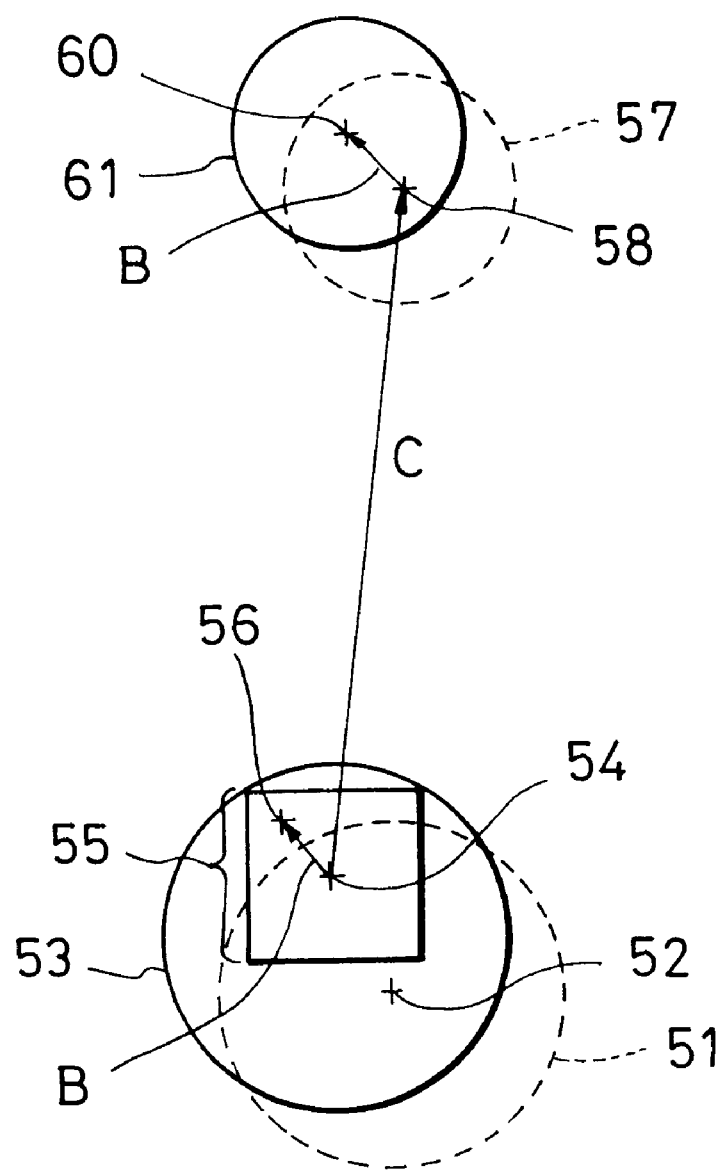
FIG. 12 is a vector diagram showing a conventional example of a mark detecting system, which lies in the ideal position.
Figure 13:
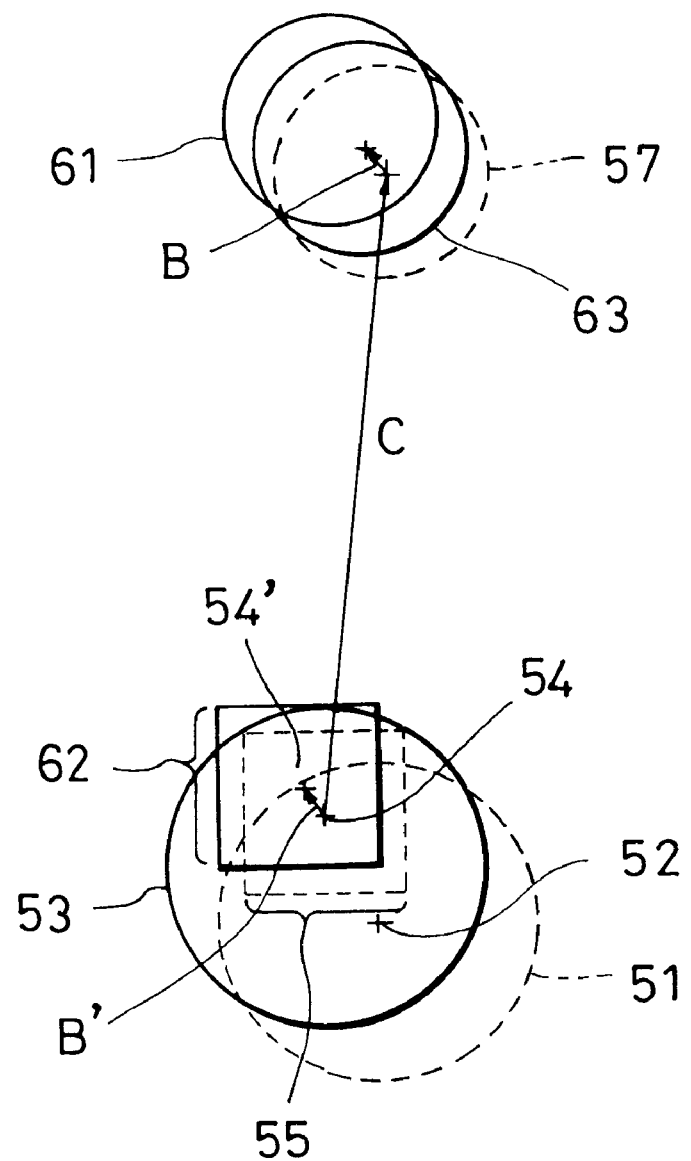
FIG. 13 is a vector diagram showing a conventional example of a mark detecting system, which has changed position.

FIG. 11 is a detailed flow chart of the above-mentioned wafer process (step 34). In step 41 (oxidation), the surface of the wafer is oxidized. In step 42 (CVD), an insulation film is formed on the surface of the wafer. In step 43 (electrode formation), electrodes are formed on the wafer by evaporation. In step 44 (ion implantation), ions are implanted into the wafer. In step 45 (resist processing), a photosensitive material is applied onto the wafer. In step 46 (exposure), using the exposure apparatus described above, the circuit pattern on the mask is printed and exposed onto the wafer. In step 47 (development), the exposed wafer is developed. In step 48 (etching), an area excluding the developed resist image is etched. In step 49 (resist stripping), any unnecessary resist after etching is removed. By repeating the above steps, multiple circuit patterns are formed on the wafer.

Except as otherwise disclosed herein, the various components shown in outline or in block form in the Figures are individually well known and their internal construction and operation are not critical either to the making or using of this invention or to a description of the best mode of the invention.

While the present invention has been described with reference to what are at present considered to be the preferred embodiments, it is to be understood that the invention is not limited to the disclosed embodiments. To the contrary, the invention is intended to cover various modifications and equivalent arrangements, included within the spirit and scope of the appended claims. The scope of the following claims is to be accorded the broadest interpretation so as to encompass all such modifications and equivalent structures and functions.

What is claimed is:

1. An apparatus for fabricating a semiconductor, said apparatus comprising:

a stage for holding a substrate to which treatment is performed, the substrate having a mark formed thereon;

a hand for carrying the substrate to said stage, said hand having a reference mark formed thereon; and a mark detecting system for detecting the mark formed on the substrate, before the substrate is transferred to said stage, and for detecting the reference mark of said hand; and means responsive to the detected mark on the substrate and the detected reference mark of the hand for roughly positioning the substrate.

2. An apparatus according to claim 1, further comprising means for adjusting the relative position between said hand and said stage on the basis of the detection by said mark detecting system.

3. An apparatus according to claim 1, wherein said mark detecting system detects the mark of the substrate and the reference mark of said hand while the substrate is moved relative to said mark detecting system.

4. An apparatus according to claim 1, further comprising treatment means for treating the substrate on said stage.

5. An apparatus according to claim 4, wherein said treatment means performs at least one of fine alignment and exposure treatment.

6. An apparatus according to claim 1, wherein said mark detecting system detects the mark of the substrate while the substrate is held with said hand.

7. An apparatus for fabricating a semiconductor, said apparatus comprising:

a stage for holding a substrate to which treatment is performed, the substrate having marks formed thereon;

a hand for carrying the substrate to said stage; and a mark detecting system for detecting the marks formed on the substrate, before the substrate is transferred to said stage, in order to roughly position the substrate, wherein said hand carries the substrate onto said stage after rotating said stage in a rotational direction in response to the detection by said mark detecting system.

8. An apparatus according to claim 7, wherein said mark detecting system detects the marks a plurality of times, while the substrate is moved relative to said mark detecting system.

9. An apparatus according to claim 8, further comprising means for calculating a deviation in the rotational direction by detecting at least two marks.

10. An apparatus according to claim 7, further comprising treatment means for treating the substrate on said stage.

11. An apparatus according to claim 10, wherein said treatment means performs at least one of fine alignment and exposure treatment.

12. An apparatus according to claim 7, wherein said mark detecting system detects the marks of the substrate while the substrate is held with a prealignment mechanism.

13. An apparatus according to claim 7, wherein said mark detecting system detects the marks of the substrate while the substrate is held with said hand.

* * * * *